United States Patent
Wang

(10) Patent No.: US 12,114,546 B2
(45) Date of Patent: Oct. 8, 2024

(54) ARRAY SUBSTRATE INCLUDING CONNECTION LAYER AND DISPLAY PANEL HAVING THE SAME

(71) Applicant: SHENZHEN CHINA STAR OPTOELECTRONICS SEMICONDUCTOR DISPLAY TECHNOLOGY CO., LTD., Shenzhen (CN)

(72) Inventor: Ruonan Wang, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/427,612

(22) PCT Filed: Jul. 16, 2021

(86) PCT No.: PCT/CN2021/106810
§ 371 (c)(1),
(2) Date: Jul. 30, 2021

(87) PCT Pub. No.: WO2022/267115
PCT Pub. Date: Dec. 29, 2022

(65) Prior Publication Data
US 2024/0040864 A1    Feb. 1, 2024

(30) Foreign Application Priority Data
Jun. 22, 2021   (CN) .......................... 202110691882.0

(51) Int. Cl.
*H01L 29/08*    (2006.01)
*H10K 59/122*   (2023.01)
(Continued)

(52) U.S. Cl.
CPC ......... *H10K 59/131* (2023.02); *H10K 59/122* (2023.02); *H10K 59/80517* (2023.02);
(Continued)

(58) Field of Classification Search
CPC ............... H10K 59/131; H10K 59/122; H10K 59/80517; H10K 2102/102; H10K 2102/351; H10K 2102/103
(Continued)

(56) References Cited

U.S. PATENT DOCUMENTS

2003/0234608 A1  12/2003  Lee et al.
2017/0012086 A1   1/2017  Kim et al.
(Continued)

FOREIGN PATENT DOCUMENTS

CN    104538428 A    4/2015
CN    106531768 A    3/2017
(Continued)

OTHER PUBLICATIONS

Chinese Office Action issued in corresponding Chinese Patent Application No. 202110691882.0 dated Mar. 11, 2022, pp. 1-8.
(Continued)

*Primary Examiner* — Phuc T Dang
(74) *Attorney, Agent, or Firm* — PV IP PC; Wei Te Chung

(57) ABSTRACT

An array substrate and a display panel are provided. The array substrate includes a substrate, a planarization layer, a connection layer, and an anode layer. The planarization layer is disposed on a side of the substrate and is provided with a first via hole. The connection layer includes a connecting portion. The connecting portion is disposed in the first via hole and extends to a surface of the planarization layer. The anode layer is disposed on a surface of the connecting portion away from the planarization layer. In the array
(Continued)

substrate, the connecting portion is disposed between the planarization layer and the anode layer, which can prevent pixels of the display panel from generating black dots.

19 Claims, 4 Drawing Sheets

(51) Int. Cl.
*H10K 59/131* (2023.01)
*H10K 59/80* (2023.01)
*H10K 102/00* (2023.01)
*H10K 102/10* (2023.01)

(52) U.S. Cl.
CPC . *H10K 2102/102* (2023.02); *H10K 2102/103* (2023.02); *H10K 2102/351* (2023.02)

(58) Field of Classification Search
USPC .......................................................... 257/40
See application file for complete search history.

(56) References Cited

U.S. PATENT DOCUMENTS

| | | | |
|---|---|---|---|
| 2017/0358638 | A1 | 12/2017 | Murakami et al. |
| 2020/0258947 | A1* | 8/2020 | Chung ................. H10K 50/824 |
| 2021/0066437 | A1* | 3/2021 | Ryu ..................... H10K 59/131 |
| 2021/0408477 | A1* | 12/2021 | Park ..................... H10K 50/844 |
| 2022/0115488 | A1* | 4/2022 | Shin ..................... H10K 59/131 |

FOREIGN PATENT DOCUMENTS

| | | |
|---|---|---|
| CN | 109638054 A | 4/2019 |
| CN | 109994536 A | 7/2019 |
| CN | 209418506 U | 9/2019 |
| CN | 110571252 A | 12/2019 |
| CN | 112201678 A | 1/2021 |
| CN | 112820741 A | 5/2021 |
| WO | WO-2022227154 A * 11/2022 | ......... H10K 59/1213 |

OTHER PUBLICATIONS

Chinese Office Action in corresponding Chinese Patent Application No. 202110691882.0 dated Jun. 6, 2022, pp. 1-7.
International Search Report in International application No. PCT/CN2021/106810, mailed on Mar. 22, 2022.
Written Opinion of the International Searching Authority in International application No. PCT/CN2021/106810, mailed on Mar. 22, 2022.

* cited by examiner

ARRAY SUBSTRATE INCLUDING CONNECTION LAYER AND DISPLAY PANEL HAVING THE SAME

RELATED APPLICATIONS

This application is a Notional Phase of PCT Patent Application No. PCT/CN2021/106810 having international filing date of Jul. 16, 2021, which claims the benefit of priority of Chinese Patent Application No. 202110691882.0 filed on Jun. 22, 2021. The contents of the above applications are all incorporated by reference as if fully set forth herein in their entirety.

FIELD OF INVENTION

The present disclosure relates to the technical field of display, and particularly to an array substrate and a display panel.

BACKGROUND

A planarization layer in a current array substrate contains sulfur element (S). The planarization layer is usually provided with an anode layer on its side. A material of the anode layer usually contains silver element (Ag). The sulfur element in the planarization layer easily diffuses to the anode layer to form black silver sulfide. When the array substrate is used in a display panel, the display panel is prone to a problem of pixels generating black dots. Therefore, it is necessary to provide a solution to prevent the pixels of the display panel from generating black dots.

SUMMARY OF DISCLOSURE

A purpose of the present disclosure is to provide an array substrate and a display panel to solve the problem that pixels of display panels in the prior art are prone to generate black spots.

The present disclosure provides an array substrate comprising:
  a substrate;
  a planarization layer disposed on a side of the substrate and provided with a first via hole;
  a connection layer comprising a connecting portion, wherein the connecting portion is disposed in the first via hole and extends to a surface of the planarization layer; and
  an anode layer disposed on a surface of the connecting portion away from the planarization layer.

In some embodiments, the connecting portion comprises a first sub-connecting portion and a second sub-connecting portion. The first sub-connecting portion covers the first via hole. The second sub-connecting portion is disposed on the surface of the planarization layer. There is a gap between the first sub-connecting portion and the second sub-connecting portion. The anode layer covers the first sub-connecting portion, the second sub-connecting portion, and a part of the planarization layer located at the gap. The first sub-connecting portion and the second sub-connecting portion are connected by the anode layer.

In some embodiments, the array substrate further comprises a first metal layer, a buffer layer, a semiconductor layer, a gate insulating layer, a gate layer, an interlayer dielectric layer, a second metal layer, and a passivation layer disposed in sequence.

In some embodiments, the second metal layer comprises a source electrode, a drain electrode, and a first binding portion. The source electrode is connected to the connecting portion, and the first binding portion is connected to the first metal layer.

In some embodiments, the planarization layer is further provided with a second via hole. The connection layer further comprises a second binding portion. The second binding portion is disposed in the second via hole and is connected to the first binding portion.

In some embodiments, the array substrate further comprises a pixel defining layer. The pixel defining layer is provided with a first opening and a second opening. The first opening exposes the anode layer. The second opening corresponds to the second via hole and exposes the second binding portion.

In some embodiments, the second metal layer further comprises a first electrode plate connected to the first metal layer.

In some embodiments, the connection layer is made of one or more of molybdenum, titanium, molybdenum/titanium, a titanium alloy, and indium tin oxide.

In some embodiments, the anode layer comprises a first sublayer made of indium tin oxide or indium zinc oxide, a second sublayer made of silver or silver alloy, and a third sublayer made of indium tin oxide or indium zinc oxide.

In some embodiments, a part of the connecting portion between the anode layer and the planarization layer has a thickness of 30 nm to 300 nm.

The present disclosure further provides a display panel comprising an array substrate. The array substrate comprises:
  a substrate;
  a planarization layer disposed on a side of the substrate and provided with a first via hole;
  a connection layer comprising a connecting portion, wherein the connecting portion is disposed in the first via hole and extends to a surface of the planarization layer; and
  an anode layer disposed on a surface of the connecting portion away from the planarization layer.

In some embodiments, the connecting portion comprises a first sub-connecting portion and a second sub-connecting portion. The first sub-connecting portion covers the first via hole. The second sub-connecting portion is disposed on the surface of the planarization layer. There is a gap between the first sub-connecting portion and the second sub-connecting portion. The anode layer covers the first sub-connecting portion, the second sub-connecting portion, and a part of the planarization layer located at the gap. The first sub-connecting portion and the second sub-connecting portion are connected by the anode layer.

In some embodiments, the array substrate further comprises a first metal layer, a buffer layer, a semiconductor layer, a gate insulating layer, a gate layer, an interlayer dielectric layer, a second metal layer, and a passivation layer disposed in sequence.

In some embodiments, the second metal layer comprises a source electrode, a drain electrode, and a first binding portion. The source electrode is connected to the connecting portion, and the first binding portion is connected to the first metal layer.

In some embodiments, the planarization layer is further provided with a second via hole. The connection layer further comprises a second binding portion. The second binding portion is disposed in the second via hole and is connected to the first binding portion.

In some embodiments, the array substrate further comprises a pixel defining layer. The pixel defining layer is provided with a first opening and a second opening. The first opening exposes the anode layer. The second opening corresponds to the second via hole and exposes the second binding portion.

In some embodiments, the second metal layer further comprises a first electrode plate connected to the first metal layer.

In some embodiments, the connection layer is made of one or more of molybdenum, titanium, molybdenum/titanium, a titanium alloy, and indium tin oxide.

In some embodiments, the anode layer comprises a first sublayer made of indium tin oxide or indium zinc oxide, a second sublayer made of silver or silver alloy, and a third sublayer made of indium tin oxide or indium zinc oxide.

In some embodiments, a part of the connecting portion between the anode layer and the planarization layer has a thickness of 30 nm to 300 nm.

The present disclosure provides an array substrate and a display panel. The array substrate comprises a substrate, a planarization layer, a connection layer, and an anode layer. The planarization layer is disposed on a side of the substrate and is provided with a first via hole. The connection layer comprises a connecting portion. The connecting portion is disposed in the first via hole and extends to a surface of the planarization layer. The anode layer is disposed on a surface of the connecting portion away from the planarization layer. In the array substrate provided by the present disclosure, the connecting portion is disposed between the planarization layer and the anode layer, which prevents sulfur element in the planarization layer from diffusing into the anode layer, and prevents silver element in the anode layer from forming sulfides, thereby solving the problem of black spots in pixels of the display panel, and improving a display effect of the display panel.

BRIEF DESCRIPTION OF DRAWINGS

In order to more clearly illustrate technical solutions in the present disclosure, a brief description of accompanying drawings used in a description of embodiments will be given below. Obviously, the accompanying drawings in the following description are merely some embodiments of the present disclosure. For those skilled in the art, other drawings may be obtained from these accompanying drawings without creative labor.

DETAILED DESCRIPTION

Figure 1:
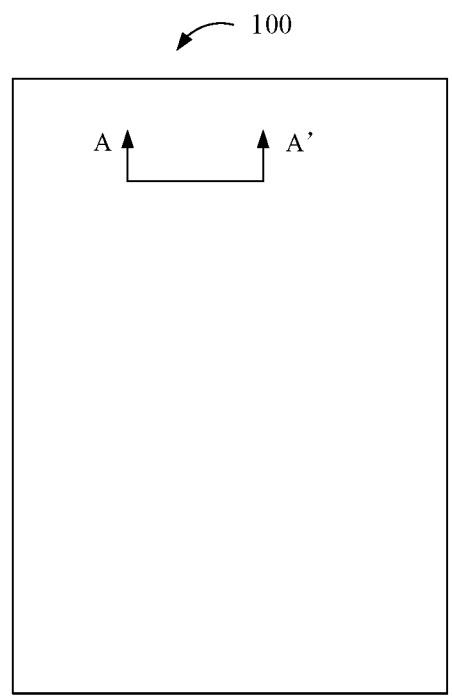
FIG. 1 is a schematic structural diagram of an array substrate according to an embodiment of the present disclosure.

Technical solutions in embodiments of the present disclosure will be clearly and completely described below in conjunction with accompanying drawings in the embodiments of the present disclosure. Apparently, the described embodiments are merely some of the embodiments of the present disclosure and not all embodiments. All other embodiments obtained by those skilled in the art based on the embodiments of the present disclosure without creative labor are within claimed scope of the present disclosure.

it should be noted that numbering terms, such as "first", "second", "third", and "fourth", mentioned in the present disclosure do not denote any order, quantity, or importance, but rather are only used to distinguish different components. Directional terms, such as "above", "below", "left", and "right", mentioned in the present disclosure are merely used to indicate directions of the accompanying drawings. Therefore, the numbering terms, the directional terms, and spatially relative terms are used for illustrating and understanding the present disclosure rather than limiting the present disclosure. In the accompanying drawings, elements with similar structures are indicated by a same reference numeral.

The present disclosure provides an array substrate, which will be described in detail below in conjunction with specific embodiments.

Figure 2:
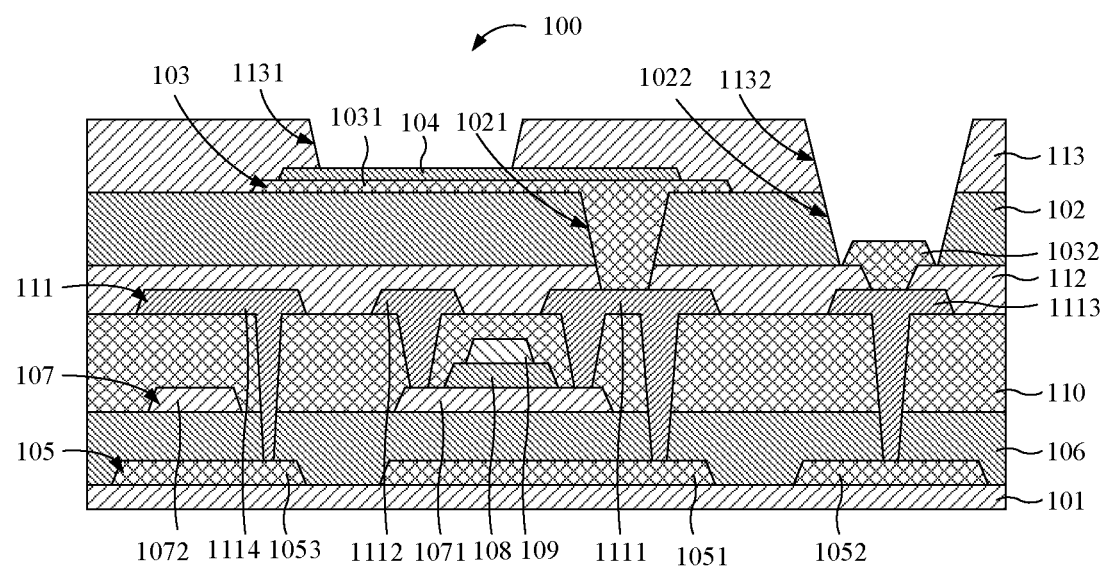
FIG. 2 is a cross-sectional view of the array substrate of FIG. 1 along a line AA' according to a first embodiment of the present disclosure.

Please refer to FIG. 1 and FIG. 2. FIG. 1 is a schematic structural diagram of an array substrate according to an embodiment of the present disclosure. FIG. 2 is a cross-sectional view of the array substrate of FIG. 1 along a line AA' according to a first embodiment of the present disclosure.

An array substrate 100 comprises a substrate 101, a planarization layer 102, a connection layer 103, and an anode layer 104. The planarization layer 102 is disposed on a side of the substrate 101. The planarization layer 102 is provided with a first via hole 1021. The connection layer 103 comprises a connecting portion 1031. The connecting portion 1031 is disposed in the first via hole 1021 and extends to a surface of the planarization layer 102. The anode layer 104 is disposed on a surface of the connecting portion 1031 away from the planarization layer 102.

The substrate 101 may be a glass substrate or a flexible substrate. The planarization layer 102 may be made of one or more of organic materials such as acrylic resin, epoxy resin, phenol resin, polyamide resin, and polyimide resin. The planarization layer 102 has a thickness of 100 nm to 500 nm. Specifically, the planarization layer 102 may have a thickness of 100 nm, 200 nm, 300 nm, 400 nm, or 500 nm. The connection layer 103 may be made of one or more of molybdenum (Mo), titanium (Ti), molybdenum (Mo)/titanium (Ti), an alloy of titanium (Ti), and indium tin oxide (ITO).

Silver (Ag) and silver alloys, such as Ag—Pd—Cu (APC), can react with sulfur (S) to form black silver sulfide. If black silver sulfide is generated in an anode layer, it is easy to cause a short circuit between a cathode electrode and an anode electrode, resulting in black spots in pixels of a display panel. In the array substrate 100 provided by the present disclosure, the connecting portion 1031 is disposed between the planarization layer 102 and the anode layer 104, which prevents sulfur (S) element in the planarization layer 102 from diffusing into the anode layer 104 and reacting with silver (Ag) or a silver alloy such as APC to form black silver sulfide, thereby avoiding a short circuit between a cathode electrode and an anode electrode, and avoiding black spots in pixels of a display panel. This is beneficial to improve a display effect of the display panel.

In some embodiments, a part of the connecting portion 1031 between the anode layer 104 and the planarization layer 102 has a thickness of 30 nm to 300 nm. Specifically, the part of the connecting portion 1031 between the anode layer 104 and the planarization layer 102 may have a thickness of 30 nm, 50 nm, 100 nm, 150 nm, 200 nm, 250 nm, or 300 nm.

When the thickness of the part of the connecting portion 1031 between the anode layer 104 and the planarization layer 102 is too thin, the sulfur element in the planarization layer 102 cannot be effectively prevented from diffusing into the anode layer 104. When the thickness of the part of the connecting portion 1031 between the anode layer 104 and the planarization layer 102 is too thick, it is not conducive to preparing a light and thin display panel. Therefore, in the present disclosure, the thickness of the part of the connecting portion 1031 between the anode layer 104 and the planarization layer 102 is set to be 30 nm to 300 nm.

Figure 3:
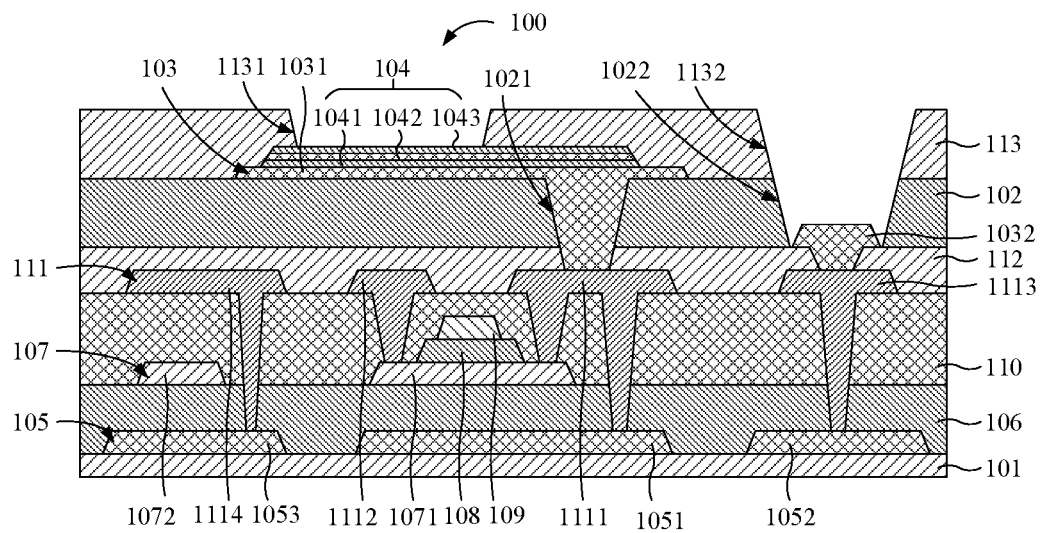
FIG. 3 is a cross-sectional view of the array substrate of FIG. 1 along the line AA' according to a second embodiment of the present disclosure.

Please refer to FIG. 3, which is a cross-sectional view of the array substrate of FIG. 1 along the line AA' according to a second embodiment of the present disclosure.

In some embodiments, the anode layer 104 comprises a first sublayer 1041, a second sublayer 1042, and a third sublayer 1043. The first sublayer 1041 is made of indium tin oxide (ITO) or indium zinc oxide (IZO). The second sublayer 1042 is made of silver (Ag) or a silver alloy such as APC. APC is an alloy formed of silver (Ag), palladium (Pd), and copper (Cu). The third sublayer 1043 is made of indium tin oxide (ITO) or indium zinc oxide (IZO).

In the present disclosure, the anode layer 104 is designed as a laminated structure comprising the first sublayer 1041, the second sublayer 1042, and the third sublayer 1043, and the second sublayer 1042 made of silver (Ag) or a silver alloy such as APC is disposed in a middle of the laminated structure, which prevents sulfur (S) element in the planarization layer 102 from diffusing into the anode layer 104 and reacting with silver (Ag) or a silver alloy such as APC to form black silver sulfide, thereby avoiding a short circuit between a cathode electrode and an anode electrode, and avoiding black spots in pixels of a display panel. This is beneficial to improve a display effect of the display panel.

In some embodiments, the array substrate 100 may further comprise a first metal layer 105, a buffer layer 106, a semiconductor layer 107, a gate insulating layer 108, a gate layer 109, an interlayer dielectric layer 110, a second metal layer 111, and a passivation layer 112 disposed in sequence.

The first metal layer 105 is disposed on a surface of the substrate 101. The first metal layer 105 may be made of a laminated metal structure of Cu/Ti or Cu/Mo/Ti. Mo is disposed between Cu and Ti to improve adhesion between Cu and Ti. The first metal layer 105 has a thickness of 50 nm to 200 nm. Specifically, the first metal layer 105 may have a thickness of nm, 100 nm, 150 nm, or 200 nm. The first metal layer 105 comprises a light shielding portion 1051, a first metal portion 1052, and a second metal portion 1053.

The buffer layer 106 is disposed on a surface of the first metal layer 105 away from the substrate 101. The buffer layer 106 may be made of one or more of silicon oxide ($SiO_x$), silicon nitride ($SiN_x$), and aluminum oxide ($AlO_x$) The buffer layer 106 has a thickness of 100 nm to 500 nm. Specifically, the buffer layer 106 may have a thickness of 100 nm, 200 nm, 300 nm, 400 nm, or 500 nm.

The semiconductor layer 107 is disposed on a surface of the buffer layer 106 away from the first metal layer 105. The semiconductor layer 107 may be made of one or more of indium gallium zinc oxide (IGZO), indium zinc tin oxide (IZTO), and indium gallium zinc tin oxide (IGZTO). The semiconductor layer 107 has a thickness of 10 nm to 100 nm. Specifically, the semiconductor layer 107 may have a thickness of 10 nm, 20 nm, 30 nm, 40 nm, 50 nm, 60 nm, 70 nm, 80 nm, 90 nm, or 100 nm. The semiconductor layer 107 comprises an active portion 1071 and a semiconductor portion 1072. The active portion 1071 comprises a channel region and a non-channel region.

The gate insulating layer 108 is disposed on a surface of the active portion 1071 away from the buffer layer 106. An orthographic projection of the gate insulating layer 108 on the substrate 101 falls within an orthographic projection of the active portion 1071 on the substrate 101. The gate insulating layer 108 may be made of silicon oxide ($SiO_x$), silicon nitride ($SiN_x$), or a stack of silicon oxide ($SiO_x$)/silicon nitride ($SiN_x$) The gate insulating layer 108 has a thickness of 50 nm to 200 nm. Specifically, the gate insulating layer 108 may have a thickness of 50 nm, 100 nm, 150 nm, or 200 nm.

The gate layer 109 is disposed on a surface of the gate insulating layer 108 away from the semiconductor layer 107. An orthographic projection of the gate layer 109 on the substrate 101 falls within the orthographic projection of the gate insulating layer 108 on the substrate 101. The gate layer 109 may be made of one or more of molybdenum (Mo), titanium (Ti), aluminum (Al), and copper (Cu). The gate layer 109 has a thickness of 200 nm to 800 nm. Specifically, the gate layer 109 may have a thickness of 200 nm, 300 nm, 400 nm, 500 nm, 600 nm, 700 nm, or 800 nm.

The interlayer dielectric layer 110 covers the buffer layer 106, the semiconductor layer 107, the gate insulating layer 108, and the gate layer 109. The interlayer dielectric layer 110 may be made of silicon oxide ($SiO_x$), silicon nitride ($SiN_x$), or a stack of silicon oxide ($SiO_x$)/silicon nitride ($SiN_x$) The interlayer dielectric layer 110 has a thickness of 200 nm to 1000 nm. Specifically, the interlayer dielectric layer 110 may have a thickness of 200 nm, 300 nm, 400 nm, 500 nm, 600 nm, 700 nm, 800 nm, 900 nm, or 1000 nm.

The second metal layer 111 is disposed on a surface of the interlayer dielectric layer 110 away from the buffer layer 106. The second metal layer 111 may be made of one or more of molybdenum (Mo), titanium (Ti), aluminum (Al), and copper (Cu). The second metal layer 111 has a thickness of 200 nm to 800 nm. Specifically, the second metal layer 111 may have a thickness of 200 nm, 300 nm, 400 nm, 500 nm, 600 nm, 700 nm, or 800 nm.

The passivation layer 112 covers the second metal layer 111. The passivation layer 112 may be made of silicon oxide ($SiO_x$), silicon nitride ($SiN_x$), or a stack of silicon oxide ($SiO_x$)/silicon nitride ($SiN_x$) The passivation layer 112 has a thickness of 100 nm to 500 nm. Specifically, the passivation layer 112 may have a thickness of 100 nm, 200 nm, 300 nm, 400 nm, or 500 nm.

In some embodiments, the second metal layer 111 comprises a source electrode 1111, a drain electrode 1112, and a first binding portion 1113. The source electrode 1111 is connected to the connecting portion 1031. The first binding portion 1113 is connected to the first metal layer 105. Specifically, the source electrode 1111 is connected to the non-channel region of the active portion 1071 and the light shielding portion 1051. The drain electrode 1112 is connected to the non-channel region of the active electrode 1071. The first binding portion 1113 is connected to the first metal portion 1052. The second metal layer 111 further comprises a first electrode plate 1114. The first electrode plate 1114 is connected to the first metal layer 105. Specifically, the first electrode plate 1114 is connected to the second metal portion 1053.

In the present disclosure, the source electrode 1111, the drain electrode 1112, the first binding portion 1113, and the first electrode plate 1114 are formed in one manufacturing process, which simplifies a manufacturing process of the array substrate 100 and saves manufacturing costs of the array substrate 100.

In the present disclosure, the first electrode plate 1114 and the second metal portion 1053 are connected to serve as an electrode plate of a capacitor. The semiconductor portion 1072 serves as the other plate of the capacitor after being converted to a conductor. The buffer layer 106 and the interlayer dielectric layer 110 serve as insulating dielectric layers of the capacitor.

In some embodiments, the planarization layer 102 is further provided with a second via hole 1022. The connection layer 103 further comprises a second binding portion 1032. The second binding portion 1032 is disposed in the second via hole 1022. The second binding portion 1032 is connected to the first binding portion 1113.

In the present disclosure, the second binding portion 1032 is connected to the first binding portion 1113, and the first binding portion 1113 is connected to the first metal portion 1052, which can be connected to an external power source to transmit electrical signals to the array substrate 100.

In some embodiments, the array substrate 100 further comprises a pixel defining layer 113. The pixel defining layer 113 is provided with a first opening 1131 and a second opening 1132. The first opening 1131 exposes the anode layer 104. The second opening 1132 corresponds to the second via hole 1022. The second opening 1132 exposes the second binding portion 1032. The pixel defining layer 113 may be made of a material with high light-shielding property, such as a material with a light transmittance of less than 15%.

In the present disclosure, the pixel defining layer 113 is provided with the first opening 1131 exposing the anode layer 104, so that a light-emitting unit can be subsequently formed in the first opening 1131. In the present disclosure, the pixel defining layer 113 is provided with the second opening 1132 exposing the second binding portion 1032, so that the second binding portion 1032 can be subsequently used to connect an external circuit to transmit electrical signals to the array substrate 100.

Figure 4:
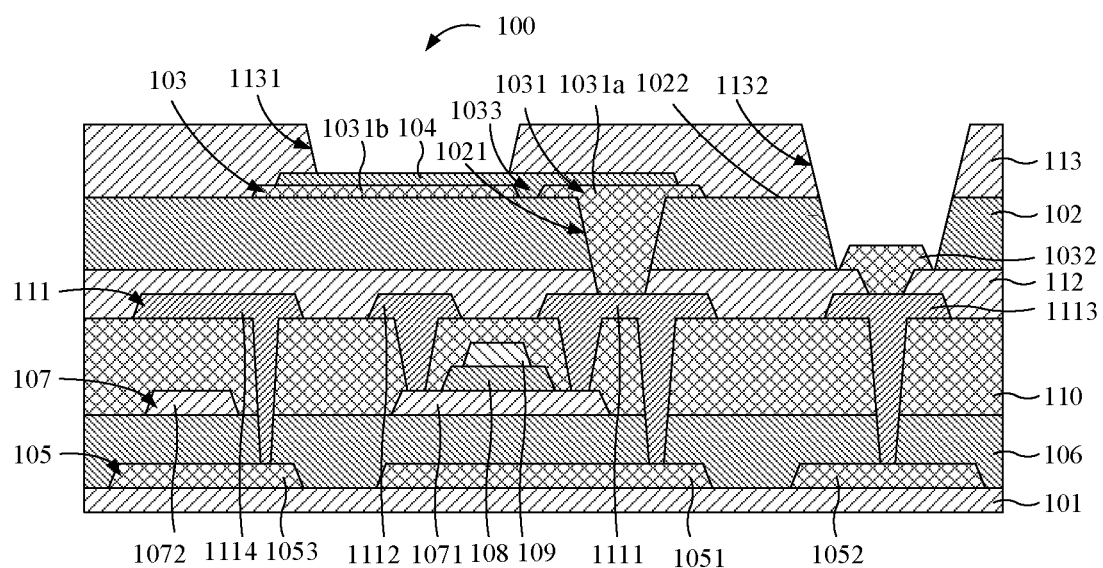
FIG. 4 is a cross-sectional view of the array substrate of FIG. 1 along the line AA' according to a third embodiment of the present disclosure.

Please refer to FIG. 4, which is a cross-sectional view of the array substrate of FIG. 1 along the line AA' according to a third embodiment of the present disclosure.

The array substrate 100 provided in the third embodiment is different from the array substrate 100 provided in the first embodiment in that the connecting portion 1031 comprises a first sub-connecting portion 1031a and a second sub-connecting portion 1031b. There is a gap 1033 between the first sub-connecting portion 1031a and the second sub-connecting portion 1031b. The first sub-connecting portion 1031a covers the first via hole 1021. The second sub-connecting portion 1031b is disposed on the surface of the planarization layer 102. The anode layer 104 covers the first sub-connecting portion 1031a, the second sub-connecting portion 1031b, and a part of the planarization layer 102 located at the gap 1033. The first sub-connecting portion 1031a and the second sub-connecting portion 1031b are connected by the anode layer 104. The second sub-connecting portion 1031b has a thickness of 30 nm to 300 nm. Specifically, the second sub-connecting portion 1031b may have a thickness of 30 nm, 50 nm, 100 nm, 150 nm, 200 nm, 250 nm, or 300 nm.

Silver (Ag) and silver alloys such as APC can react with sulfur (S) to form black silver sulfide. If black silver sulfide is generated in an anode layer, it is easy to cause a short circuit between a cathode electrode and an anode electrode, resulting in black spots in pixels of a display panel. In the array substrate 100 provided by the present disclosure, the connecting portion 1031 is disposed between the planarization layer 102 and the anode layer 104, and the connecting portion 1031 comprises a first sub-connecting portion 1031a and a second sub-connecting portion 1031b. There is a gap 1033 between the first sub-connecting portion 1031a and the second sub-connecting portion 1031b. The first sub-connecting portion 1031a covers the first via hole 1021. The second sub-connecting portion 1031b is disposed on the surface of the planarization layer 102. The anode layer 104 covers the first sub-connecting portion 1031a, the second sub-connecting portion 1031b, and a part of the planarization layer 102 located at the gap 1033. The first sub-connecting portion 1031a and the second sub-connecting portion 1031b are connected by the anode layer 104. This arrangement prevents sulfur (S) element in the planarization layer 102 from diffusing into the anode layer 104 and reacting with silver (Ag) or a silver alloy such as APC to form black silver sulfide, thereby avoiding a short circuit between a cathode electrode and an anode electrode, and avoiding black spots in pixels of a display panel. This is beneficial to improve a display effect of the display panel. In addition, in the present disclosure, the gap 1033 is provided between the first sub-connecting portion 1031a and the second sub-connecting portion 1031b, which further increases a contact area between the anode layer 104 and the connection layer 103, thereby improving stability of signal transmission.

The other components of the array substrate 100 provided in the third embodiment are same as those of the array substrate 100 provided in the first embodiment, and will not be described herein.

Figure 5:
FIG. 5 is a flow chart of a method for fabricating an array substrate according to an embodiment of the present disclosure.

Please refer to FIG. 5, which is a flow chart of a method for fabricating an array substrate according to an embodiment of the present disclosure.

The present disclosure provides a method for fabricating an array substrate, which comprises the following steps.

Step B10: forming a first metal layer on a surface of a substrate, and patterning the first metal layer to form a light shielding portion, a first metal portion, and a second metal portion.

The substrate may be a glass substrate or a flexible substrate. The first metal layer may be made of a laminated metal structure of Cu/Ti or Cu/Mo/Ti. Mo is disposed between Cu and Ti to improve adhesion between Cu and Ti. The first metal layer has a thickness of 50 nm to 200 nm. Specifically, the first metal layer may have a thickness of 50 nm, 100 nm, 150 nm, or 200 nm.

Step B20: forming a buffer layer covering the first metal layer.

The buffer layer may be made of one or more of silicon oxide ($SiO_x$), silicon nitride ($SiN_x$), and aluminum oxide ($AlO_x$) The buffer layer has a thickness of 100 nm to 500 nm. Specifically, the buffer layer may have a thickness of 100 nm, 200 nm, 300 nm, 400 nm, or 500 nm.

Step B30: sequentially forming a semiconductor layer, a gate insulating layer, a gate layer, and an interlayer dielectric layer on a surface of the buffer layer away from the first metal layer.

The semiconductor layer may be made of one or more of indium gallium zinc oxide (IGZO), indium zinc tin oxide (IZTO), and indium gallium zinc tin oxide (IGZTO). The semiconductor layer has a thickness of 10 nm to 100 nm. Specifically, the semiconductor layer may have a thickness of 10 nm, 20 nm, 30 nm, 40 nm, 50 nm, 60 nm, 70 nm, 80 nm, 90 nm, or 100 nm.

The gate insulating layer may be made of silicon oxide ($SiO_x$), silicon nitride ($SiN_x$), or a stack of silicon oxide ($SiO_x$)/silicon nitride ($SiN_x$) The gate insulating layer has a thickness of 50 nm to 200 nm. Specifically, the gate insulating layer may have a thickness of 50 nm, 100 nm, 150 nm, or 200 nm.

The gate layer may be made of one or more of molybdenum (Mo), titanium (Ti), aluminum (Al), and copper (Cu). The gate layer has a thickness of 200 nm to 800 nm. Specifically, the gate layer may have a thickness of 200 nm, 300 nm, 400 nm, 500 nm, 600 nm, 700 nm, or 800 nm.

The interlayer dielectric layer may be made of silicon oxide ($SiO_x$), silicon nitride ($SiN_x$), or a stack of silicon oxide ($SiO_x$)/silicon nitride ($SiN_x$) The interlayer dielectric layer has a thickness of 200 nm to 1000 nm. Specifically, the interlayer dielectric layer may have a thickness of 200 nm, 300 nm, 400 nm, 500 nm, 600 nm, 700 nm, 800 nm, 900 nm, or 1000 nm.

Before forming the interlayer dielectric layer, the method may further comprise: patterning the gate layer to form a gate electrode, and then using the gate electrode as a self-aligned mask to pattern the gate insulating layer.

Specifically, the gate insulating layer only exists under the gate electrode, and the gate insulating layer in other places is etched away. After patterning the gate layer to form the gate electrode, and then using the gate electrode as the self-aligned mask to pattern the gate insulating layer, the method may further comprise: treating the semiconductor layer with plasma.

Specifically, a part of the semiconductor layer not protected by the gate insulating layer and the gate electrode is treated with plasma to significantly reduce its resistance, and then it forms an N+ conductor layer. Because the other part of the semiconductor layer under the gate insulating layer is not treated with plasma, it maintains semiconductor characteristics.

After treating the semiconductor layer with plasma, the method may further comprise: patterning the semiconductor layer to form an active portion and a semiconductor portion. A part of the active portion may be treated with plasma to form a non-channel region of a thin film transistor. The other part of the active portion that is not treated with plasma may be used as a channel region of the thin film transistor. The semiconductor portion may be treated with plasma to form an electrode plate of a capacitor.

Step B40: forming a second metal layer on a surface of the interlayer dielectric layer away from the gate layer, and patterning the second metal layer to form a source electrode, a drain electrode, a first binding portion, and a first electrode plate.

Specifically, the source electrode is connected to the non-channel region of the active portion and the light shielding portion. The drain electrode is connected to the non-channel region of the active electrode. The first binding portion is connected to the first metal portion. The first electrode plate is connected to the second metal portion. The second metal layer may be made of one or more of molybdenum (Mo), titanium (Ti), aluminum (Al), and copper (Cu). The second metal layer has a thickness of 200 nm to 800 nm. Specifically, the second metal layer may have a thickness of 200 nm, 300 nm, 400 nm, 500 nm, 600 nm, 700 nm, or 800 nm. The second metal layer is patterned to form the source electrode, the drain electrode, the first binding portion, and the first electrode plate.

Step B50: forming a planarization layer covering the second metal layer, and patterning the planarization layer to form a first via hole exposing the source electrode and a second via hole exposing the first binding portion.

The planarization layer may be made of one or more of organic materials such as acrylic resin, epoxy resin, phenol resin, polyamide resin, and polyimide resin. The planarization layer has a thickness of 100 nm to 500 nm. Specifically, the planarization layer may have a thickness of 100 nm, 200 nm, 300 nm, 400 nm, or 500 nm.

Step B60: forming a connection layer on a surface of the planarization layer and in the first via hole and the second via hole, and patterning the connection layer to form a connecting portion located on the surface of the planarization layer and in the first via hole and a second binding portion located in the second via hole.

Specifically, the connecting portion is connected to the source electrode. The second binding portion is connected to the first binding portion. The connection layer may be made of one or more of molybdenum (Mo), titanium (Ti), molybdenum (Mo)/titanium (Ti), an alloy of titanium (Ti), and indium tin oxide (ITO). A part of the connecting portion located on the surface of the planarization layer has a thickness of 30 nm to 300 nm. Specifically, the part of the connecting portion located on the surface of the planarization layer may have a thickness of 30 nm, 50 nm, 100 nm, 150 nm, 200 nm, 250 nm, or 300 nm.

Step B70: sequentially forming an anode layer and a pixel defining layer on a surface of the connecting portion away from the planarization layer, and patterning the pixel defining layer to form a first opening exposing the anode layer and a second opening exposing the second binding portion.

The anode layer comprises a first sublayer, a second sublayer, and a third sublayer. The first sublayer is made of indium tin oxide (ITO) or indium zinc oxide (IZO). The second sublayer is made of silver (Ag) or a silver alloy such as APC. APC is an alloy formed of silver (Ag), palladium (Pd), and copper (Cu). The third sublayer is made of indium tin oxide (ITO) or indium zinc oxide (IZO). The pixel defining layer may be made of a material with high light-shielding property, such as a material with a light transmittance of less than 15%.

Silver (Ag) and silver alloys, such as APC, can react with sulfur (S) to form black silver sulfide. If black silver sulfide is generated in an anode layer, it is easy to cause a short circuit between a cathode electrode and an anode electrode, resulting in black spots in pixels of a display panel. In the array substrate provided by the present disclosure, the connecting portion is disposed between the planarization layer and the anode layer, which prevents sulfur (S) element in the planarization layer from diffusing into the anode layer and reacting with silver (Ag) or a silver alloy such as APC to form black silver sulfide, thereby avoiding a short circuit between a cathode electrode and an anode electrode, and avoiding black spots in pixels of a display panel. This is beneficial to improve a display effect of the display panel.

Figure 6:
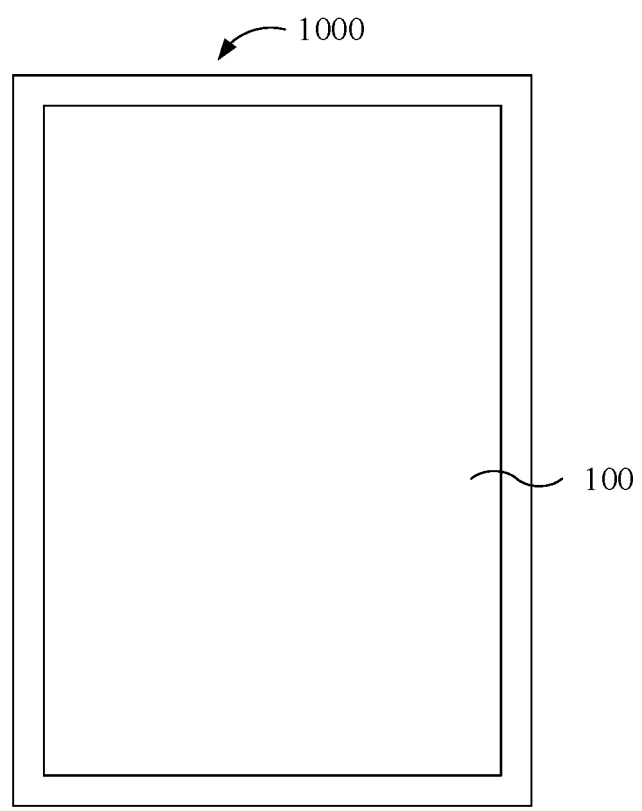
FIG. 6 is a schematic structural diagram of a display panel according to an embodiment of the present disclosure.

Please refer to FIG. 6, which is a schematic structural diagram of a display panel according to an embodiment of the present disclosure.

A display panel 1000 provided by the present disclosure comprises the array substrate 100 described in any of the foregoing embodiments.

The display panel provided by the present disclosure comprises the array substrate. In the array substrate provided by the present disclosure, the connecting portion is disposed between the planarization layer and the anode layer, which prevents sulfur (S) element in the planarization layer 102 from diffusing into the anode layer 104 and reacting with silver (Ag) or a silver alloy such as APC to form black silver sulfide, thereby avoiding a short circuit between a cathode electrode and an anode electrode, and avoiding black spots in pixels of a display panel. This is beneficial to improve a display effect of the display panel.

In the above, the embodiments of the present disclosure are described in detail, but the above embodiments are not intended to limit the present invention. It should be understood by those skilled in the art that they can modify the technical solutions recited in the foregoing embodiments, or replace some of technical features in the foregoing embodiments with equivalents. These modifications or replacements do not cause essence of corresponding technical solutions to depart from the scope of the technical solutions of the embodiments of the present disclosure.

What is claimed is:

1. An array substrate, comprising:
   a substrate;
   a planarization layer disposed on a side of the substrate and provided with a first via hole;
   a connection layer comprising a connecting portion, wherein the connecting portion is disposed in the first via hole and extends to a surface of the planarization layer; and
   an anode layer disposed on a surface of the connecting portion away from the planarization layer,
   wherein the connecting portion comprises:
      a first sub-connecting portion covering the first via hole; and
      a second sub-connecting portion disposed on the surface of the planarization layer, wherein there is a gap between the first sub-connecting portion and the second sub-connecting portion, the anode layer covers the first sub-connecting portion, the second sub-connecting portion, and a part of the planarization layer located at the gap, and the first sub-connecting portion and the second sub-connecting portion are connected by the anode layer.

2. The array substrate according to claim 1, further comprising a first metal layer, a buffer layer, a semiconductor layer, a gate insulating layer, a gate layer, an interlayer dielectric layer, a second metal layer, and a passivation layer disposed in sequence.

3. The array substrate according to claim 2, wherein the second metal layer comprises a source electrode, a drain electrode, and a first binding portion, the source electrode is connected to the connecting portion, and the first binding portion is connected to the first metal layer.

4. The array substrate according to claim 3, wherein the planarization layer is further provided with a second via hole, the connection layer further comprises a second binding portion, and the second binding portion is disposed in the second via hole and is connected to the first binding portion.

5. The array substrate according to claim 4, further comprising a pixel defining layer, wherein the pixel defining layer is provided with a first opening and a second opening, the first opening exposes the anode layer, and the second opening corresponds to the second via hole and exposes the second binding portion.

6. The array substrate according to claim 2, wherein the second metal layer further comprises a first electrode plate connected to the first metal layer.

7. The array substrate according to claim 1, wherein the connection layer is made of one or more of molybdenum, titanium, molybdenum/titanium, a titanium alloy, and indium tin oxide.

8. The array substrate according to claim 1, wherein the anode layer comprises:
   a first sublayer made of indium tin oxide or indium zinc oxide;
   a second sublayer made of silver or silver alloy; and
   a third sublayer made of indium tin oxide or indium zinc oxide.

9. The array substrate according to claim 1, wherein a part of the connecting portion between the anode layer and the planarization layer has a thickness of 30 nm to 300 nm.

10. A display panel, comprising an array substrate, wherein the array substrate comprises:
    a substrate;
    a planarization layer disposed on a side of the substrate and provided with a first via hole;
    a connection layer comprising a connecting portion, wherein the connecting portion is disposed in the first via hole and extends to a surface of the planarization layer; and
    an anode layer disposed on a surface of the connecting portion away from the planarization layer,
    wherein the connecting portion comprises:
       a first sub-connecting portion covering the first via hole; and
       a second sub-connecting portion disposed on the surface of the planarization layer, wherein there is a gap between the first sub-connecting portion and the second sub-connecting portion, the anode layer covers the first sub-connecting portion, the second sub-connecting portion, and a part of the planarization layer located at the gap, and the first sub-connecting portion and the second sub-connecting portion are connected by the anode layer.

11. The display panel according to claim 10, wherein the array substrate further comprises a first metal layer, a buffer layer, a semiconductor layer, a gate insulating layer, a gate layer, an interlayer dielectric layer, a second metal layer, and a passivation layer disposed in sequence.

12. The display panel according to claim 11, wherein the second metal layer comprises a source electrode, a drain electrode, and a first binding portion, the source electrode is connected to the connecting portion, and the first binding portion is connected to the first metal layer.

13. The display panel according to claim 12, wherein the planarization layer is further provided with a second via hole, the connection layer further comprises a second binding portion, and the second binding portion is disposed in the second via hole and is connected to the first binding portion.

14. The display panel according to claim 13, wherein the array substrate further comprises a pixel defining layer, the pixel defining layer is provided with a first opening and a second opening, the first opening exposes the anode layer, and the second opening corresponds to the second via hole and exposes the second binding portion.

15. The display panel according to claim 11, wherein the second metal layer further comprises a first electrode plate connected to the first metal layer.

16. The display panel according to claim 10, wherein the connection layer is made of one or more of molybdenum, titanium, molybdenum/titanium, a titanium alloy, and indium tin oxide.

17. The display panel according to claim 10, wherein the anode layer comprises:
    a first sublayer made of indium tin oxide or indium zinc oxide;
    a second sublayer made of silver or silver alloy; and
    a third sublayer made of indium tin oxide or indium zinc oxide.

18. The display panel according to claim 10, wherein a part of the connecting portion between the anode layer and the planarization layer has a thickness of 30 nm to 300 nm.

19. An array substrate, comprising:
a substrate;
a planarization layer disposed on a side of the substrate and provided with a first via hole;
a connection layer comprising a connecting portion, wherein the connecting portion is disposed in the first via hole and extends to a surface of the planarization layer; and
an anode layer disposed on a surface of the connecting portion away from the planarization layer,
wherein the array substrate further comprises a first metal layer, a buffer layer, a semiconductor layer, a gate insulating layer, a gate layer, an interlayer dielectric layer, a second metal layer, and a passivation layer disposed in sequence,
wherein the second metal layer comprises a source electrode, a drain electrode, and a first binding portion, the source electrode is connected to the connecting portion, and the first binding portion is connected to the first metal layer.

* * * * *